United States Patent [19]

Haslow et al.

[11] Patent Number: 5,779,921

[45] Date of Patent: Jul. 14, 1998

[54] METHOD FOR SELECTIVELY PLATING AN ORGANIC SUBSTRATE

[75] Inventors: Randy E. Haslow; Donald G. Hutchins; Michael R. Leaf, all of Eau Claire, Wis.

[73] Assignee: W. L. Gore & Associates, Inc., Newark, Del.

[21] Appl. No.: 745,980

[22] Filed: Nov. 8, 1996

[51] Int. Cl.$^6$ .................................................. B44C 1/22
[52] U.S. Cl. ........................... 216/13; 216/20; 216/41; 216/56; 205/125; 205/135; 205/927
[58] Field of Search ............................ 216/13, 20, 41, 216/56; 205/118, 122, 125, 135, 927

[56] References Cited

U.S. PATENT DOCUMENTS

| | | | |
|---|---|---|---|
| 2,699,425 | 1/1955 | Nieter | 216/13 X |
| 3,053,929 | 9/1962 | Friedman | 216/13 X |
| 3,801,427 | 4/1974 | Morishita et al. | 216/20 X |
| 3,953,566 | 4/1976 | Gore | 264/288 |
| 4,482,516 | 11/1984 | Bowman et al. | 264/127 |
| 4,705,762 | 11/1987 | Ota | 501/87 |
| 4,985,296 | 1/1991 | Mortimer, Jr. | 428/220 |

*Primary Examiner*—William Powell
*Attorney, Agent, or Firm*—Victor M. Genco, Jr.

[57] ABSTRACT

The present invention relates to a process for metallizing features of an electronic component, where the metallized features, conductive pads, conductive traces, are coated and encapsulated with at least one metal layer and the features on the front side and the back side of the component have different thicknesses

36 Claims, 1 Drawing Sheet

METHOD FOR SELECTIVELY PLATING AN ORGANIC SUBSTRATE

FIELD OF THE INVENTION

The present invention relates to process for the fabrication of substrates having a differential front to back terminal metal thickness. More specifically, the present invention relates to a process for metallized features of an electronic component, where the metallized features, conductive pads, and conductive traces are further coated with a metal coating.

BACKGROUND OF THE INVENTION

In the past, differential front to back plating was often accomplished strictly by using the plate and etch method of circuit fabrication. This has the disadvantage of leaving the base metal exposed at circuit edges adjacent to the dielectric substrate.

It is accordingly an objective of the present invention to provide a method of making substrates having differential front to back terminal metal thickness and wherein the fabricated product does not have the disadvantages of substrates made by prior procedures.

SUMMARY OF THE INVENTION

The present invention relates to a process for the preparation of an organic based circuit board or integrated circuit package comprising a dielectric layer having conductive features with differential front to back terminal metal thicknesses.

The instant process comprises a step-wise procedure wherein the back of the substrate is protected while the front of the substrate is imaged and electroplated followed by protecting the front of the substrate while the back of the substrate is imaged and plated. A front side of the substrate which has undergone electroplating is covered with solder mask and shielded, and then the back of the substrate is electroplated by electroless and/or immersion plating. The conductive features of the substrate are plated metal using the process of the present invention.

BRIEF DESCRIPTION OF THE DRAWING

The FIGURE illustrates a scanning electronmicrograph of a preferred expanded polytetrafluoroethylene substrate prior to imbibing according to the present invention.

DETAILED DESCRIPTION OF THE INVENTION

Figure 1:
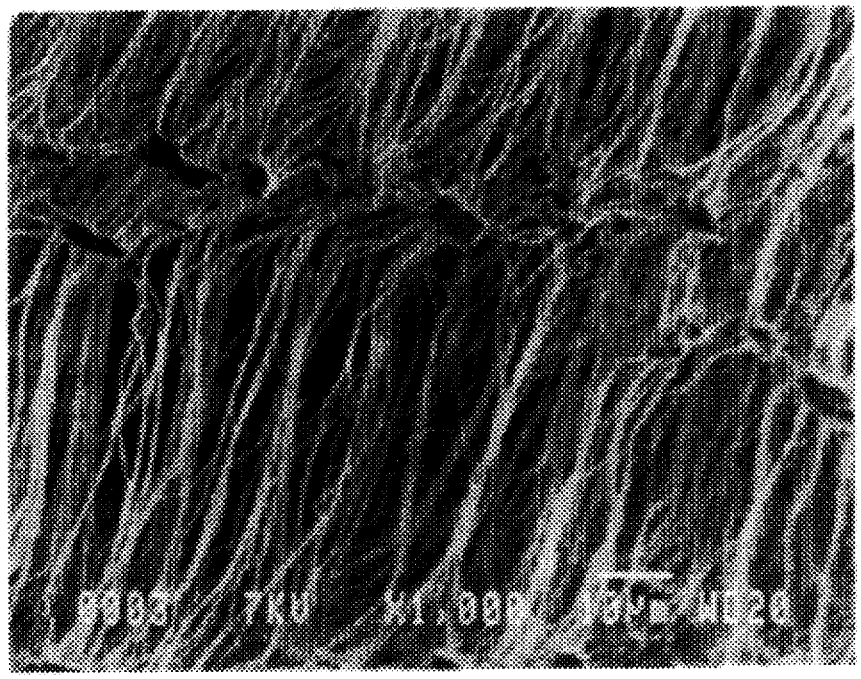

The present invention provides a process for preparing an electronic component, such as, an organic based circuit board or integrated circuit where the front of the substrate has terminal metal thereon with a thickness different from the terminal metal thickness on the back of the substrate of the circuit board or integrated circuit. The present invention provides a product having no exposed base metal at the edges of circuit features, such as conductive pads, or traces, which are on the substrate, as well as providing differential front to back terminal metal thicknesses. As a result, the conductive features of the electronic components are encapsulated by the electroplated metal.

In the present invention, the electronic components include substrates on which the differential front to back terminal metal thicknesses are formed in accordance with the invention, where the substrate includes at least one dielectric layer and conductive metal layers. The dielectric layer is comprised of a synthetic resin or plastic material and will be described in greater detail below.

The photoresist materials and solder mask materials which are employed are known to those working in this art area and the ordinary artisan is well equipped to choose from the generally known and useful resists and masks. Electroplating and electroless plating and immersion plating techniques are also known and it is to be appreciated that those working in this art area can readily conduct such procedures and choose appropriate such procedures for the various steps of the instant process. These variables and limitations are not critical to the present invention and, hence, an exhaustive description of known materials and techniques is not provided herein.

In the present invention, the starting substrate is broadly an organic dielectric material having a conductive metal layer on the front and back side thereof. The conductive metal layer is preferably a layer of copper while the dielectric material is preferably a fluoropolymer-based layer, an example of which is described below. Also, reference is made to the two sides of the substrate as the front and the back side for the purpose of simplicity in the present invention. Clearly, the side with the greater thickness can be the front or the back side, and the side with the lesser thickness is that side opposite the side with the greater thickness of terminal metal.

In carrying out the process of the present invention, the side with the greater thickness of terminal metal is carried out first followed by the fabrication of the lesser thickness of terminal metal. It is important that there be no through holes in the substrate since through holes would interfere with the separate fabrication of the front and back sides. The front side of the substrate must be electrically bussed to the back side of the substrate during electroplating of the front side. After electroplating of the front side, the front side is protected and features or sites are fabricated on the back side. More specifically, in the process, after solder masking and shielding the front side, the features on the back side are plated with metal by electroless plating or immersion plating.

In the present invention a substrate is provided with the different terminal metal layers as follows:

FRONT SIDE
1. coating or laminating the substrate with a photoresist so that both the front and back sides are covered with photoresist;
2. imaging and developing the front side followed by etching of the front side to remove any unprotected metal layer and form conductive features such as, but not limited to, traces, conductive pads, etc;
3. stripping the photoresist from both the front and back sides; and
4. protecting the back side, electrically bussing the front side from the back side and electroplating the features of the front side.

This sequence of steps allows the formation of conductive features on the front side wherein the thickness of the metal plating is greater than 15µ inches in thickness. The encapsulation can be total encapsulation, thereby none of the edges of the unplated features are exposed.

In one embodiment of the invention, gold is electroplated onto the copper features of the front side. If desired, a nickel barrier layer may be electroplated onto the copper layer prior to electroplating of the gold layer. It is understood that while the invention is illustrated with the electroplating of gold, other metals including platinum, palladium or rhodium can be also employed. Similarly, other known barrier metal layers may be used.

BACK SIDE

The formation of the back side features is carried out utilizing the following steps, whereby the thickness of the plated metal is less than that on the front side:

1. coating or laminating the finished front side and the back side of the substrate with photoresist;
2. imaging and developing the back side followed by etching of the back side to remove any unprotected metal layer;
3. stripping the undeveloped photoresist front both the front and back sides;
4. providing a layer of photoreactive solder mask onto both the front and back sides of the substrate;
5. imaging and developing the front side and back side solder mask to provide solder masking of selected areas; and
6. shielding the front side and plating the features of the back side by electroless and/or immersion plating.

This sequence of steps allows the formation of features on the back side of the substrate wherein the thickness of the metal plated on the features is less than 15μ, inches in thickness. The metals plated on the back side features can be the same as those plated on the front side features. However, it is important that the plating of the back side features be carried out by electroless plating and/or immersion plating. The thickness of the plated metal on the back side features is from about 1 to less than 15μ inches.

DIELECTRIC MATERIALS

As discuss above, the substrate includes any suitable dielectric material can be used as substrates in the present, such as, but not limited to, polyimides and polyimide laminates, epoxy resins, epoxy resins in combination with other resin material, organic materials, alone or any of the above combined with fillers. Preferred dielectric materials include a fluoropolymer matrix, where the fluoropolymer can be PTFE, ePTFE or copolymers or blends. Suitable fluoropolymers include, but are not limited to, polytetrafluoroethylene or expanded polytetrafluoroethylene, with or without an adhesive filler mixture.

In one embodiment of the present invention, the substrate was formed from Speedboard® bond plies available from W. L. Gore and Associates, Inc., such as, Speedboard® C which is a prepreg of non-woven material containing a cyanate ester resin in a polytetrafluoroethylene matrix. Speedboard® C has a dielectric constant, (Dk) of 2.6–2.7 at 1 MHz-10 GHz, a loss tangent of 0.004 at 1 MHz-10 GHz, a dielectric strength greater than 1000 V/mil, a glass transition ($T_g$) of 220° C., a resin content of 66–68 wt. % and is available in a variety of thicknesses.

In another embodiment of the present invention the dielectric materials include those where a porous matrix system contains an imbibed or impregnated adhesive-filler mixture. The porous matrix is a non-woven substrate that is imbibed with high quantities of filler and a thermoplastic or thermoset adhesive, as a result of the initial void volume of the substrate, heated to partially cure the adhesive and form a B-stage composite. Substrates include fluoropolymers, such as the porous expanded polytetrafluoroethylene material of U.S. Pat. Nos. 3,953,566 and 4,482,516, each of which is incorporated herein by reference. Desirably, the mean flow pore size (MFPS) of the substrate should be between about 2 to 5 times or above that of the largest particulate, with a MFPS of greater than about 2.4 times that of the filler being particularly preferred. However, it is also within the scope of the invention that suitable composites can be prepared by selecting the ratio of the mean flow pore size to average particle size to be greater than 1.4. Acceptable composites can also be prepared when the ratio of the minimum pore size to average particle size is at least above 0.8, or the ratio of the minimum pore size to the maximum particle size is at least above 0.4. The MFPS to particle size ratios may be determined with a Microtrak® Model FRA Particle Analyzer device. Another mechanism for gauging relative pore and particle sizes may be calculated as the smallest pore size being not less than about 1.4 times the largest particle size.

In addition to expanded fluoropolymer substrates, porous expanded polyolefins, such as ultra high molecular weight (UHMW) polyethylene, expanded polypropylene, polytetrafluoroethylene made prepared by paste extrusion and incorporating sacrificial fillers, porous inorganic or organic foams, microporous cellulose acetate, can be used.

The porous substrate has an initial void volume of at least 30%, preferably at least 50%, and most preferably at least 70%, and facilitates the impregnation of thermoset or thermoplastic adhesive resin and particulate filler paste in the voids while providing a flexible reinforcement to prevent brittleness of the overall composite and settling of the particles. The filler comprises a collection of particles when analyzed by a Microtrak® Model FRA Particle Analyzer device, which displays a maximum particle size, a minimum particle size and an average particle size by way of a histogram.

Suitable fillers to be incorporated into the adhesive include, but are not limited to, $BaTiO_3$, $SiO_2$, $Al_2O_3$, ZnO, $ZrO_2$, $TiO_2$, precipitated and sol-gel ceramics, such as silica, titania and alumina, non-conductive carbon (carbon/furnace black) and mixtures thereof. Especially preferred fillers are $SiO_2$, $ZrO_2$, $TiO_2$ alone or in combination with non-conductive carbon. Most preferred fillers include filler made by the vapor metal combustion process taught in U.S. Pat. No. 4,705,762, such as, but not limited to silicon, titanium and aluminum to produced silica, titania, and alumina particles that are solid in nature. i.e., not a hollow sphere, with a uniform surface curvature and a high degree of sphericity.

The fillers may be treated by well-known techniques that render the filler hydrophobic by silylating agents and/or agents reactive to the adhesive matrix, such as, coupling agents. Suitable coupling agents include, silanes, titanates, zirconates, and aluminates. Suitable silylating agents may include, but are not limited to, functional silylating agents, silazanes, silanols, siloxanes. Suitable silazanes, include, but are not limited to, hexamethyldisilazane (Huls H730) and hexamethylcyclo-trisilazane, silylamides such as, bis (trimethylsilyl)acetamide (Huls B2500), silylureas such as trimethylsilylurea, and silylimidazoles such as trimethylsilylimidazole.

Titanate coupling agents are exemplified by the tetra alkyl type, monoalkoxy type, coordinate type, chelate type, quaternary salt type, neoalkoxy type, cycloheteroatom type. Preferred titanates include, tetra alkyl titanates, Tyzor® TOT {tetrakis(2-ethyl-hexyl} titanate, Tyzor® TPT {tetraisopropyl titanate}, chelated titanates, Tyzor® GBA {titanium acetylacetylacetonate}, Tyzor® DC {titanium ethylacetacetonate}, Tyzor® CLA {proprietary to DuPont}. Monoalkoxy (Ken-React® KR TTS), Ken-React®, KR-55 tetra (2,2 diallyloxymethyl)butyl, di(ditridecyl)phosphito titanate, LICA® 38 neopentyl(diallyl)oxy, tri(dioctyl)pyrophosphato titanate.

Suitable zirconates include, any of the zirconates detailed at page 22 in the Kenrich catalog, in particular KZ 55- tetra (2,2 diallyloxymethyl)butyl, di(ditridecyl)phosphito zirconate, NZ-01- neopentyl(diallyl)oxy, trineodecanoyl zirconate, NZ-09-neopentyl(diallyl)oxy, tri(dodecyl) benzene-sulfonyl zirconate.

The aluminates that can be used in the present invention include, but are not limited to Kenrich®, diisobutyl(oleyl)-acetoacetylaluminate (KA 301), diisopropyl(oleyl) acetoacetyl aluminate (KA 322) and KA 489.

In addition to the above, certain polymers, such as, cross-linked vinylic polymers, e.g., divinylbenzene, divinyl pyridine or a sizing of any of the disclosed thermosetting matrix adhesives that are first applied at very high dilution (0.1 up to 1.0% solution in MEK) can be used. Also, certain organic peroxides, such as, dicumylperoxide can be reacted with the fillers. The adhesive itself may be a thermoset or thermoplastic and can include polyglycidyl ether, polycyanurate, polyisocyanate, bis-triazine resins, poly (bis-maleimide), norbornene-terminated polyimide, polynorbornene, acetylene-terminated polyimide, polybutadiene and functionalized copolymers thereof, cyclic olefinic polycyclobutene, polysiloxanes, poly sisqualoxane, functionalized polyphenylene ether, polyacrylate, novolak polymers and copolymers, fluoropolymers and copolymers, melamine polymers and copolymers, poly(bis phenycyclobutane), and blends or prepolymers thereof. It should be understood that the aforementioned adhesives may themselves be blended together or blended with other polymers or additives, so as to impact flame retardancy or enhanced toughness.

As used herein, mean flow pore size and minimum pore size were determined using the Coulter® Porometer II (Coulter Electronics Ltd., Luton UK) which reports the value directly. Average particle size and largest particle size were determined using a Microtrak® light scattering particle size analyzer Model No. FRA (Microtrak Division of Leeds & Northup, North Wales, Pa., USA). The average particle size (APS) is defined as the value at which 50% of the particles are larger. The largest particle size (LPS) is defined as the largest detectable particle on a Microtrak histogram. Alternatively, the largest particle size is defined at the minimum point when the Microtrak® Model FRA determines that 100% of the particulate have passed.

In general, the method for preparing the adhesive-filler dielectric involves:(a) expanding a polytetrafluoroethylene sheet by stretching a lubricated extruded perform to a microstructure sufficient to allow small particles and adhesives to free flow into the void or pore volume; (b) forming a paste from polymeric, e.g., thermoset or thermoplastic material and a filler; and (c) imbibing by dipping, coating, pressure feeding, the adhesive-filler paste into the highly porous scaffold, such as expanded polytetrafluoroethylene.

To prepare the filled adhesive film of this invention, particulate filler is mixed into a solvent or aqueous solution or molten adhesive to afford a finely dispersed mixture. The filler in small particle form is ordinarily less than 40 microns in size, and preferably has an average particulate size between 1 and 10 microns. The mean pore size of the node-and-fibril structure of the polytetrafluoroethylene should be large enough to allow for adequate penetration of the particulate.

Table 1 shows the effect of the relationship of the substrate mean flow pore size (MFPS) and particulate size. When the ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

TABLE 1

| Sample | Substrate Pore Size | | Particle Size | | $MFPS \div Part_{Avg}$ | $Pore_{Min} \div Part_{Max}$ | $Pore_{Min} \div Part_{Avg}$ | Result |
|---|---|---|---|---|---|---|---|---|
| | Min (μm) | MFPS (μm) | Avg (μm) | Max (μm) | | | | |
| A | 4 | 7 | 5 | 10 | 1.4 | 0.4 | 0.8 | Poor |
| B | 4 | 5 | 5 | 10 | 1.0 | 0.4 | 0.8 | Poor |
| C | — | 58 | 5 | 10 | 12.4 | N/A | — | Good |
| D | 18 | 32 | 6 | 10 | 5.3 | 1.8 | 3.0 | Good |
| E | 18 | 32 | 1 | 1 | 32.0 | 18.0 | 18 | Good |
| F | 17 | 24 | 6 | 10 | 4.0 | 1.7 | 2.8 | Good |
| G | 0.2 | 0.4 | 0.5 | 1.6 | 0.8 | 0.125 | 0.4 | Poor |
| H | — | 60 | 18 | 30 | 3.3 | — | — | Good |
| I | 14 | 11 | 0.5 | 1.6 | 22.0 | 8.8 | 28 | Good |
| J | 14 | 29 | 4 | 8 | 7.3 | 1.8 | 3.5 | Good |
| K | 14 | 29 | 5 | 10 | 5.8 | 1.4 | 2.8 | Good |

EXAMPLE 1

A fine dispersion was prepared by mixing 281.6 g TiO$_2$ (TI Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible composite. The partially-cured adhesive composite thus produced comprised 57 weight percent TiO$_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 mm (0.0039"(3.9 mil)) dielectric laminate thickness.

EXAMPLE 2

A fine dispersion was prepared by mixing 386 g SiO$_2$ (HW-11-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent $SiO_2$, 5 weight percent PTFE and 42 weight percent adhesive, displayed good adhesion to copper, dielectric constant (at 10 GHz) of 3.3 and dissipation factor (at 10 GHz) of 0.005.

EXAMPLE 3

A fine dispersion was prepared by mixing 483 g $SiO_2$ (HW-11-89) into a manganese-catalyzed solution of 274.7 g bismaleimide triazine resin (BT2060BJ, Mitsubishi Gas Chemical) and 485 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent $SiO_2$, 4 weight percent PTFE and 39 weight percent adhesive, displayed good adhesion to copper, dielectric constant (at 10 GHz) of 3.2 and dissipation factor (at 10 GHz) of 0.005.

EXAMPLE 4

A fine dispersion was prepared by mixing 15.44 kg $TiO_2$ powder (TI Pure R-900, DuPont Company) into a manganese-catalyzed solution of 3.30 kg bismaleimide triazine resin (BT2060BH, Mitsubishi Gas Chemical) and 15.38 kg MEK. The dispersion was constantly agitated so as to insure uniformity. A swatch of 0.0004" $TiO_2$-filled expanded PTFE (filled according to the teachings of Mortimer U.S. Pat. No. 4,985,296, except to 40% loading of $TiO_2$ and the membrane was not compressed at the end) was then dipped into the resin mixture, removed, and then dried at 165° C. for 1 min. under tension to afford a flexible composite. The partially cured adhesive composite thus produced comprised of 70 weight percent $TiO_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation 10 factor of 0.008.

EXAMPLE 5

A fine dispersion was prepared by mixing 7.35 kg $SiO_2$ (ADMATECHS SO-E2, Tatsumori LTD) with 7.35 kg MEK and 73.5 g of coupling agent, i.e.,3-glycidyloxypropyltrimethoxysilane (Dynasylan GLYMO (Petrach Systems). SO-E2 is described by the manufacture as having highly spherical silica having a particle diameter of 0.4 to 0.6 mm, a specific surface area of 4–8 $m^2/g$, a bulk density of 0.2–0.4 g/cc (loose).

To this dispersion was added 932 g of a 50% (w/w) solution of a cyanated phenolic resin, Primaset PT-30 (Lonza Corp.). In (MEK) methylethylketone, 896 g of a 50% (w/w) solution of RSL 1462 (Shell Resins, Inc.(CAS #25068-38-6)) in MEK, 380 g of a 50% (w/w) solution of BC-58 (Great Lakes, Inc.) in MEK, 54 g of 50% solution of bisphenol A (Aldrich Company) in MEK, 12.6 g Irganox 1010 (Ciba Geigy), 3.1 g of a 0.6% solution of Manganese 2-ethylhexanoate (Mn HEX-CEM (OMG Ltd.), and 2.40 kg MEK. This dispersion was subjected to ultrasonic agitation through a Misonics continuous flow cell for about 20 minutes at a rate of about 1–3 gal./minute. The fine dispersion thus obtained was further diluted to an overall bath concentration of 11.9% solids (w/w).

The fine dispersion was poured into an impregnation bath. A expanded polytetrafluoroethylene web having the node fibril structure of the sole figure and the following properties was used as the substrate:

| Frazier | 20.55 |
|---|---|
| Coverage | 9 $g/m^2$ |
| Ball Burst | 3.2 lbs. |
| Thickness | 6.5 mil. |
| Mean Flow Pore Size | 9.0 microns |

The Frazier number relates to the air permeability of the material being assayed. Air permeability is measured by clamping the web in a gasketed fixture which is provided in circular area of approximately 6 square inches for air flow measurement. The upstream side was connected to a flow meter in line with a source of dry compressed air. The downstream side of the sample fixture was open to the atmosphere. Testing is accomplished by applying a pressure of 0.5 inches of water to the upstream side of the sample and recording the flow rate of the air passing through the in-line flowmeter (a ball-float rotameter that was connected to a flow meter.

The Ball Burst Strength is a test that measures the relative strength of samples by determining the maximum at break. The web is challenged with a 1 inch diameter ball while being clamped between two plates. The Chatillon, Force Gauge Ball/Burst Test was used. The media is placed taut in the measuring device and pressure afixed by raising the web into contact with the ball of the burst probe. Pressure at break is recorded.

The web described above and shown in the sole figure was passed through a constantly agitated impregnation bath at a speed at or about 3 ft./min, so as to insure uniformity. The impregnated web is immediately passed through a heated oven to remove all or nearly all the solvent, and is collected on a roll.

Several plies of this prepreg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.0085 (10 GHz).

The physical properties of the particulate filler used in Example 2 and Example 5 are compared below.

| Property | Tatsumori (ADMATECHS) | Harbison Walker |
|---|---|---|
| Manufacture Technique | Vapor Metal Combustion | Amorphous Fused Silica |
| Designation | Silica SO-E2 | HW-11-89 |
| Median Particle Size | 0.5 micron | 5 micron |
| Shape | Spherical | Irregular, jagged |
| Surface Area | 6–10 $m^2/g$ | 10 $m^2/g$ |

| | | |
|---|---|---|
| Bulk Density | 0.47 g/cc | 1.12 g/cc |
| Specific Density | 2.26 g/cc | 2.16 g/cc |

EXAMPLE 6

An ePTFE matrix containing an impregnated adhesive filler mixture, based on $SiO_2$ prepared from the vapor combustion of molten silicon is prepared as follows. Two precursor mixtures were initially prepared. One being in the form of a slurry containing a silane treated silica similar to that of Example 5 and the other an uncatalyzed blend of the resin and other components.

Mixture I

The silica slurry is a 50/50 blend of the SO-E2 silica of Example 5 in MEK, where the silica contains a coating of silane which is equal to 1% of the silica weight. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container.

Mixture II

The desired resin blend product is an MEK based mixture containing an uncatalyzed resin blend (the adhesive) containing approximately 60% solids, where the solid portion is an exact mixture of 41.2% PT-30 cyanated phenolic resin, 39.5% RSL 1462 epoxy resin, 16.7% BC58 flame retardant, 1.5% Irganox 1010 stabilizer, and 1% bisphenol A co-catalyst, all percentages by weight.

Into a ten gallon container, 14.8 pounds of PT-30 and 15–20 pounds of MEK were added and stirred vigorously to completely solvate the PT-30. Then 6 pounds of BC58 were measured and added to the MEK/PT-30 solution and vigorously agitated to solvate the BC58. The stabilizer, 244.5 grams of Irganox 1010 and bisphenol A, 163 grams were added. The ten gallon container was reweighed and 14.22 pounds of RSL 1462 were added. Additional MEK was added to bring the mixture weight to 60 pounds. The contents were then vigorously agitated for approximately 1 to 2 hours, or as long is necessary to completely dissolve the solid components.

The desired product is a mixture of the silica treated with a silane, the uncatalyzed resin blend, and MEK in which 68% by weight of the solids are silica, and the total solids are between 5% and 50% by weight of the mixture. The exact solids concentration varies from run to run, and depends in part on the membrane to be impregnated. The catalyst level is 10 ppm relative to the sum of the PT-30 and RSL1462.

The solid contents of mixtures I and II were determined to verify the accuracy of the precursors and compensate for any solvent flash that had occurred. Then mixture I was added to a ten gallon container to provide 12 pounds of solids, e.g., 51% solids content, 23.48 pounds of mixture I. Then mixture II was added to the container to provide 5.64 pounds of solids, e.g., 59.6% solids, 9.46 pounds of mixture II. the manganese catalyst solution (0.6% in mineral spirits), 3.45 grams, was added to the mixture of mixture I and mixture II and blended thoroughly to form a high solids content mixture.

The bath mixture for impregnating an ePTFE matrix, 28% solids mixture, was prepared by adding sufficient MEK to the high solids content mixture to a total weight of 63 pounds.

Thereafter, an ePTFE matrix was impregnated with this bath mixture to form a dielectric material.

EXAMPLE 7

A fine dispersion was prepared by mixing 26.8 grams Furnace Black (Special Schwarz 100, Degussa Corp., Ridgefield Park, N.J.) and 79 grams of coupling agent (Dynaslan GLYMO CAS #2530-83-8; 3-glycidyloxypropyl-trimethoxysilane (Petrach Systems). The dispersion was subjected to ultrasonic agitation for 1 minute, then added to a stirring dispersion of 17.5 pounds $SiO_2$ (SO-E2) in 17.5 pounds MEK which had previously been ultrasonically agitated. The final dispersion was heated with constant overhead mixing for 1 hour at reflux, then allowed to cool to room temperature.

Separately, an adhesive varnish was prepared by adding the following: 3413 grams of a 57.5% (w/w) mixture of Primaset PT-30 in MEK, 2456 grams of a 76.8% (w/w/) mixture of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mu HEX-CEM (OMG Ltd.) in mineral spirits, and 2.40 kg MEK.

In a separate container, 3739 grams of the dispersion described above was added, along with 0.0233 grams of Furnace Black (Special Schwarz 100, Degussa Corp., Ridgefield Park, N.J.), 1328 of the adhesive varnish described above and 38.3 pounds MEK. This mixture was poured into an impregnation bath, and an ePTFE web was passed through the impregnation bath at a speed at or about 3 ft/min. This dispersion was constantly agitated so as to insure uniformity. The impregnated web is immediately passed through a heated oven to remove all or nearly all the solvent, and is collected on a roll.

Several piles of this prepreg were laid up between copper foil and pressed at 200 psi in a vacuum-assisted hydraulic press at temperatures of 200° C. for 90 minutes then cooled under pressure. This resulting dielectric displayed good adhesion to copper.

EXAMPLE 8

An adhesive varnish was prepared by adding the following: 3413 grams of a 57.5% (w/w) solution of Primaset PT-30 (PMN P-88-1591)) in MEK, 2456 grams of a 76.8% (w/w) solution of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mn HEX-CEM in mineral spirits, and 2.40 kg MEK.

In a separate container, 1328 grams of the adhesive varnish described above, 42.3 pounds MEK, 6.40 grams of Furnace Black (Special Schwarz 100, Degussa Corp., Ridgefield, N.J.) and 1860.9 grams $SiO_2$ (SO-E2). This mixture was poured into an impregnation bath, and an ePTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll.

Several piles of this prepreg were laid up between copper foil and pressed at 200 psi in a vacuum-assisted hydraulic press at temperature of 220° C. for 90 minutes then cooled under pressure. This resulting dielectric displayed good adhesion to copper.

It will be understood by those skilled in the art that various modifications and substitutions may be made to the invention as described above without departing from the spirit and scope of the invention. Accordingly, it is understood that the present invention has been described by way of illustration and not limitation.

What is claimed:

1. A method for making a substrate having differential front to back terminal metal thickness comprising the steps of:
   a) providing an organic based substrate having a conductive metal layer on a front and back side thereof;
   b) protecting the back side of the substrate, metallizing the front side wherein said metallizing is conducted by electroplating while electrically bussing the front side with the back side; and
   c) unprotecting the back side and protecting the front side and metallizing the back side by at least one of electroless plating or immersion plating.

2. The method of claim 1, wherein the protecting of the front side and the back side comprises applying a photoresist to the front side or the back side.

3. The method of claim 1, further comprising applying and patterning a solder mask to the substrate prior to metallizing the back side.

4. The method of claim 3, further comprising shielding said front side during metallization of the back side.

5. The method of claim 1, wherein metallization of the front side comprises the steps of:
   1). coating or laminating the substrate with a photoresist so that both the front and back sides are covered with photoresist;
   2). imaging and developing the front side followed by etching of the front side to remove any unprotected metal layer;
   3). stripping the photoresist from both the front and back sides; and
   4). protecting the back side, electrically bussing the front side from the back side and electroplating the features of the topside.

6. The method of claim 1, wherein the metallization of the back side comprises the steps of:
   1). coating or laminating the finished front side and the back side of the substrate with photoresist;
   2). imaging and developing the back side followed by etching of the back side to remove any unprotected metal layer;
   3). stripping the undeveloped photoresist on both the front and back sides;
   4). providing a layer of photoreactive solder mask onto both the front and back sides of the substrate;
   5). imaging and developing the front side and back side solder mask to provide solder masking of selected areas; and
   6). shielding the front side and plating the features of the back side by electroless or immersion plating.

7. The method according to claim 1, wherein the organic based substrate comprises a fluoropolymer.

8. The method according to claim 1, wherein the organic based substrate comprises a polytetrafluoroethylene.

9. The method according to claim 1, wherein the organic based substrate comprises a fluoropolymer which is expanded polytetrafluoroethylene.

10. The method according to claim 1, wherein the organic based substrate comprises a porous olefin.

11. The method according to claim 1, wherein the organic based substrate comprises a polyethylene or polypropylene.

12. The method according to claim 1, wherein the organic based substrate contains a $SiO_2$ formed from the combustion of molten silicon.

13. The method according to claim 1, wherein the organic based substrate comprises a thermosetting or thermoplastic compound.

14. The method according to claim 1, wherein the organic based substrate comprises at least one of epoxy resin, cyanate ester resin or polybutadiene resin as the adhesive resin.

15. The method according to claim 1, wherein the organic based substrate comprises an organic, open cellular material.

16. The method according to claim 1, wherein the organic based substrate comprises a sponge or foam.

17. The method according to claim 1, wherein the organic based substrate comprises a ratio of mean flow pore size to the largest particle size or the smallest particle size or the average particle size is at least 2.

18. The method according to claim 1, wherein the organic based substrate contains a filler is $BaTiO_3$, $SiO_2$, $Al_2O_3$, ZnO or solder.

19. A substrate having a differential front to back terminal metal thickness prepared by the method of claim 1.

20. A substrate having a differential front to back terminal metal thickness prepared by the method of claim 2.

21. A substrate having a differential front to back terminal metal thickness prepared by the method of claim 3.

22. A substrate having a differential front to back terminal metal thickness prepared by the method of claim 4.

23. A substrate having a differential front to back terminal metal thickness prepared by the method of claim 5.

24. A substrate having a differential front to back terminal metal thickness prepared by the method of claim 6.

25. A substrate having a differential front to back terminal metal thickness prepared by the method of claim 7.

26. A substrate having a differential front to back terminal metal thickness prepared by the method of claim 8.

27. A substrate having a differential front to back terminal metal thickness prepared by the method of claim 9.

28. A substrate having a differential front to back terminal metal thickness prepared by the method of claim 10.

29. A substrate having a differential front to back terminal metal thickness prepared by the method of claim 11.

30. A substrate having a differential front to back terminal metal thickness prepared by the method of claim 12.

31. A substrate having a differential front to back terminal metal thickness prepared by the method of claim 13.

32. A substrate having a differential front to back terminal metal thickness prepared by the method of claim 14.

33. A substrate having a differential front to back terminal metal thickness prepared by the method of claim 15.

34. A substrate having a differential front to back terminal metal thickness prepared by the method of claim 16.

35. A substrate having a differential front to back terminal metal thickness prepared by the method of claim 17.

36. A substrate having a differential front to back terminal metal thickness prepared by the method of claim 18.

* * * * *